US009576767B2

(12) United States Patent
Bhattacharjee et al.

(10) Patent No.: US 9,576,767 B2
(45) Date of Patent: Feb. 21, 2017

(54) FOCUSED ION BEAM SYSTEMS AND METHODS OF OPERATION

(71) Applicant: Indian Institute of Technology Kanpur, Kanpur (IN)

(72) Inventors: Sudeep Bhattacharjee, Kanpur (IN); Jose Vettiyankal Mathew, Mumbai (IN)

(73) Assignee: INDIAN INSTITUTE OF TECHNOLOGY KANPUR, Uttar Pradesh (IN)

( * ) Notice: Subject to any disclaimer, the term of this patent is extended or adjusted under 35 U.S.C. 154(b) by 0 days.

(21) Appl. No.: 14/891,046

(22) PCT Filed: Mar. 18, 2014

(86) PCT No.: PCT/IB2014/059922
§ 371 (c)(1),
(2) Date: Nov. 13, 2015

(87) PCT Pub. No.: WO2014/184689
PCT Pub. Date: Nov. 20, 2014

(65) Prior Publication Data
US 2016/0093463 A1    Mar. 31, 2016

(30) Foreign Application Priority Data
May 15, 2013  (IN) .................................. 1452/2013

(51) Int. Cl.
*H01J 37/05* (2006.01)
*H01J 37/08* (2006.01)
*H01J 37/305* (2006.01)

(52) U.S. Cl.
CPC .............. *H01J 37/05* (2013.01); *H01J 37/08* (2013.01); *H01J 37/3056* (2013.01); *H01J 2237/0817* (2013.01); *H01J 2237/31749* (2013.01)

(58) Field of Classification Search
CPC ...... H01J 37/08; H01J 2237/006; H01J 27/16; H01J 2237/0817; H01J 49/105; H01J 37/32357; H01J 2237/08
(Continued)

(56) References Cited

U.S. PATENT DOCUMENTS

| 5,825,035 A | 10/1998 | Mizumura et al. |
|---|---|---|
| 6,541,781 B1 | 4/2003 | Benveniste et al. |
| 2008/0237496 A1* | 10/2008 | Gupta ..................... H01J 37/08 250/492.21 |

FOREIGN PATENT DOCUMENTS

JP         H07320670 A       12/1995

OTHER PUBLICATIONS

Chowdhury, A., and Bhattacharjee, S., "Localized subsurface modification of materials using micro-low-energy multiple ion beamlets," AIP Advances, vol. 1, pp. 042150-1-042150-17 (2011).
(Continued)

*Primary Examiner* — Tuyet Vo
(74) *Attorney, Agent, or Firm* — Turk IP Law, LLC (57) ABSTRACT

A focused ion beam system is provided. The focused ion beam system includes a plasma generation chamber configured to contain a source gas that is radiated with microwaves to produce plasma. The plasma generation chamber includes a plasma confinement device configured to confine the plasma in radial and axial directions within the plasma generation chamber and to form a plasma meniscus at an extraction end of the plasma generation chamber. The focused ion beam system also includes a beam extraction chamber configured to extract a focused ion beam from the
(Continued)

confined plasma and to focus the extracted focused ion beam on a workpiece.

20 Claims, 3 Drawing Sheets

(58) Field of Classification Search
USPC ............ 250/423 R, 424, 423 F, 489, 492.21, 250/492.3
See application file for complete search history.

(56) References Cited

OTHER PUBLICATIONS

Dey, I., and Bhattacharjee, S., "Penetration and screening of perpendicularly launched electromagnetic waves through bounded supercritical plasma confined in multicusp magnetic field," Physics of Plasmas, vol. 18, Issue 2, pp. 022101-1-022101-11 (2011).
International Search Report and Written Opinion for International Application No. PCT/IB2014/059922 mailed on Sep. 15, 2014.
Jiali, Li, et al., "Ion-beam sculpting at nanometre length scales," Nature, vol. 412, pp. 166-169 (Jul. 12, 2001).
Jiang, X., et al., "Mini rf-driven ion sources for focused ion beam systems," Review of Scientific Instruments, vol. 74, Issue 4, pp. 2288-2297 (2003).
Mathew, J.V., and Bhattacharjee, S., "Multi-element focused ion beams using compact microwave plasma ion source," Indian Journal of Physics, vol. 85, No. 12, pp. 1863-1870 (Dec. 2011).
Mathew, J.V., et al., "Subcutoff microwave driven plasma ion sources for multielemental focused ion beam systems," Review of scientific instruments, vol. 79, Issue 6, 063504-1-063504-5 (Jul. 2008).
Mathew, Jose V.,et al., "Ion energy distribution near a plasma meniscus with beam extraction for multi element focused ion beams," Journal of Applied Physics, vol. 107, Issue 9, 093306-1-093306-1 (Jun. 2010).
Reyntjens S., and Puers, R., "A review of focused ion beam applications in microsystem technology," Journal of Micromechanics and Microengineering, vol. 11, No. 4, pp. 287-300 (2004).
Smith, N. S., et al., "High brightness inductively coupled plasma source for high current focused ion beam applications," Journal of Vacuum Science & Technology B, vol. 24, Issue 6, pp. 2902-2906, (Nov. 2006).
Smith, N.S., et al., "A high brightness plasma source for focused ion beam applications," Microscopy and Microanalysis, vol. 13, Supplement S02, pp. 180-181, (Aug. 2007).
Tondare, V. N., "Quest for high brightness, monochromatic noble gas ion sources," Journal of Vacuum Science & Technology a Vacuum Surfaces and films, Chapter 1, vol. 23, Issue 6, pp. 1498-1508 (2005).
Mathew, Jose V., and Bhattacharjee, Sudeep, "Ion energy distribution near a plasma meniscus for multielement focused ion beams", Journal of Applied Physics, vol. 105, Issue 9, 096101 (2009).
Mathew, Jose V., et al., "Microwave guiding and intense plasma generation at sub-cutoff dimensions for focused ion beams," Applied Physics Letters, vol. 91, Issue 4, 041503-041505 (2007).

* cited by examiner

FOCUSED ION BEAM SYSTEMS AND METHODS OF OPERATION

CROSS-REFERENCE TO RELATED APPLICATIONS

This Application is the U.S. National Stage filing under 35 U.S.C. §371 of PCT Application Set. No. PCT/IB2014/059922 filed on Mar. 18, 2014, which claims priority to Indian Patent Application Serial No. 1452/DEL/2013, filed on May 15, 2013, and titled "FOCUSED ION BEAM SYSTEMS AND METHODS OF OPERATION", the disclosures of the PCT and Indian Patent Applications are incorporated herein in their entirety.

BACKGROUND

Focused ion beams (FIBs) are used in a variety of nanoscience and technology applications such as micromachining and nanofabrication of semiconductor chips. For example, focused ion beams are currently used for applications such as maskless implantation into semiconductor materials, lithographic mask repair for visible light and X-rays, high precision machining of mesoscopic structures, deposition of materials from the vapor phase by ion-induced deposition, modification of integrated circuits, failure analysis for integrated circuit manufacturing process, surface analysis, transmission electron microscope (TEM) sample preparation, microscopy, secondary ion mass spectroscopy, and micro and nano electromechanical systems.

Certain commercially available FIB systems are based on liquid metal ion sources (LMIS) and are capable of providing focused ion beams of only gallium (Ga) ions. However, this limits the applicability and functionality of the generated focused ion beams in areas where FIBs of other elements are required.

Moreover, application of FIBs generated using gallium ions onto a substrate may have contamination issues associated with them due to gallium ions that may embed into the substrate often altering electrical and magnetic properties of the fabricated devices. In certain systems, the application of heavier mass of gallium ions on a substrate results in impact induced damage while carrying out circuit modifications on the devices and may also lead to excessive absorption of ultraviolet (UV) light by implanted gallium ions during photo-mask repair.

In certain FIB systems, gas field ion sources are used to produce gaseous ions. However, the tip surface of the system is required to be cooled to cryogenic temperatures for effective ionization. Moreover, such sources are limited to use with light ions and the current yield of these systems is substantially low.

Furthermore, FIBs generated using the conventional LMIS FIB systems provide substantially low currents thereby resulting in substantially low turnover times for performing volume processes. Improved FIBs and methods for their production and use are desirable.

SUMMARY

The foregoing summary is illustrative only and is not intended to be in any way limiting. In addition to the illustrative aspects, embodiments, and features described above, further aspects, embodiments, and features will become apparent by reference to the drawings and the following detailed description.

Briefly, in accordance with one aspect, a focused ion beam system is provided. The focused ion beam system includes a plasma generation chamber configured to contain a source gas that is radiated with microwaves to produce plasma. The plasma generation chamber includes a plasma confinement device configured to confine the plasma in radial and axial directions within the plasma generation chamber and to form a plasma meniscus at an extraction end of the plasma generation chamber. The focused ion beam system also includes a beam extraction chamber configured to extract a focused ion beam from the confined plasma and to focus the extracted focused ion beam on a workpiece.

In accordance with another aspect, a method for generating focused ion beams is provided. The method includes radiating a source gas with microwaves to generate plasma within a plasma generation chamber and confining the plasma in radial and axial directions within the plasma generation chamber and forming a plasma meniscus near an extraction end of the plasma generation chamber. The method also includes extracting focused ion beams from the confined plasma.

In accordance with another aspect, a focused ion beam system is provided. The focused ion beam system includes a plasma generation chamber configured to contain a source gas that is radiated with microwaves to produce plasma. The plasma generation chamber includes a multicusp plasma confinement device having a first set of magnets to confine the plasma in radial and axial directions within the plasma generation chamber and a second set of magnets to facilitate formation of a plasma meniscus at the extraction end of the plasma generation chamber. The system also includes a beam extraction chamber configured to extract a focused ion beam from the confined plasma in the plasma generation chamber. The beam extraction chamber includes a plasma electrode and a plurality of electrostatic lenses configured to extract the focused ion beams and to focus the extracted beams onto a workpiece placed in a workpiece processing chamber.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

It will also be understood that any compound, material or substance which is expressly or implicitly disclosed in the specification and/or recited in a claim as belonging to a group or structurally, compositionally and/or functionally related compounds, materials or substances includes individual representative of the group and all combinations thereof. While various compositions, methods, and devices are described in terms of "comprising" various components or steps (interpreted as meaning "including, but not limited to"), the compositions, methods, and devices can also "consist essentially of" or "consist of" the various components and steps and such terminology should be interpreted as defining essentially closed member groups.

Example embodiments are generally directed to techniques of generating focused ion beams that can be used for a variety of industrial applications. The techniques described herein use intense collimated high frequency plasmas in the microwave and millimeter regime. The focused ion beams formed using the present technique provide higher currents suitable for faster processing and volume milling for batch processes such as are needed in a variety of industrial applications. In particular, the present technique facilitates production of high density plasma in a compact cross section by substantially overcoming waveguide cutoff limitations. In addition, the present technique can be used for generating focused ion beams of multiple elements like inert gas ions, dopant ions, molecular and metallic ions including lighter to massive ions thereby catering to a wide range of research and industrial applications.

Figure 1:
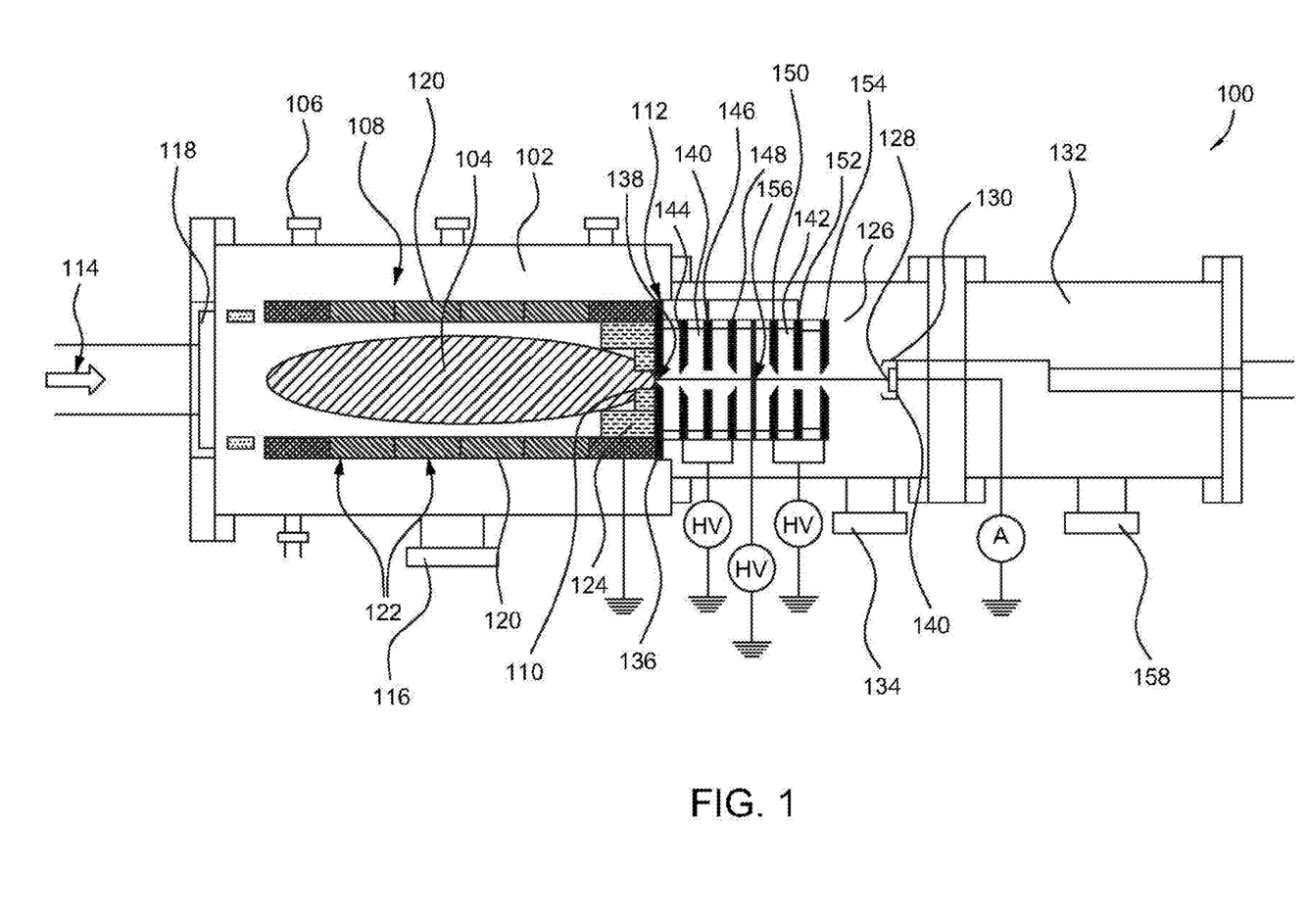
FIG. 1 is an example focused ion beam system in accordance with aspects of the present technique.

Referring now to FIG. 1, a focused ion beam (FIB) system 100 is provided. The FIB system 100 includes a plasma generation chamber 102 configured to contain a source gas that is radiated with microwaves to produce plasma 104. The FIB system 100 includes a source gas supply (not shown) containing the source gas that is supplied to the plasma generation chamber 102 via a gas inlet 106. Examples of source gas include, but are not limited to, argon (Ar), neon (Ne), krypton (Kr), radon (Rn), xenon (Xe), helium (He), molecular nitrogen ($N_2$), molecular oxygen ($O_2$), molecular hydrogen ($H_2$), or combinations thereof. In general, any gaseous element whose plasma can be created can be used as the source gas.

In the illustrated embodiment, the plasma generation chamber 102 includes a plasma confinement device 108 configured to confine the plasma 104 in radial and axial directions within the plasma generation chamber 102 and to form a plasma meniscus 110 at an extraction end 112 of the plasma generation chamber 102. The plasma confinement device 108 confines the plasma 104 in the radial and axial directions by applying multicusp magnetic field within the plasma generation chamber 102. In operation, the source gas within the plasma generation chamber 102 is radiated with microwaves 114 produced by a microwave generator (not shown) to produce the plasma 104. In certain embodiments, the plasma generation chamber 102 is maintained at a pressure of about $10^{-3}$ Torr to about $10^{-4}$ Torr, using a turbo molecular pump 116.

In one example embodiment, the microwaves 114 are produced using a magnetron oscillator. In some example embodiments, the microwaves 114 have a frequency of about 2.45 Giga Hertz (GHz) to about 18 GHz. The microwaves can have a peak power of about 300 Watts to about 2 Kilowatts. Specific examples of power include about 300 Watts, about 500 Watts, about 700 Watts, about 900 Watts, about 1.1 Kilowatts, about 1.3 Kilowatts, about 1.5 Kilowatts, about 1.7 Kilowatts, about 1.9 Kilowatts, about 2 Kilowatts, and ranges between any two of these values (including endpoints). In one example embodiment, the microwaves have a peak power of about 1.2 Kilowatts (kW). Specific examples of microwave frequency include about 2.45 GHz, about 5 GHz, about 10 GHz, about 15 GHz, about 18 GHz, and ranges between any two of these values (including endpoints). The microwaves 114 can be guided through a quartz window 118 into the plasma confinement device 108 that confines the plasma 104 within the plasma generation chamber 102.

In one example embodiment, the radius of the plasma confinement device 108 is selected to be less than a cutoff value for the fundamental waveguide mode. For example, the cutoff radius for a 2.45 GHz microwave for $TE_{11}$ mode is about 3.6 cm. In this example embodiment, for a circular waveguide and fundamental $TE_{11}$ mode, the cutoff radius $r_c$ is estimated using the following equation:

$$r_c = \rho'_{11} \lambda_o / 2\pi \quad (1)$$

where: $\rho'_{11}=1.841$ is the first root of the derivative of the Bessel function of the first kind $J_1$, $\lambda_o$ is the free space wavelength of the wave estimates to be about 2.24 cm for waves of frequency 2.45 GHz).

The radius of plasma confinement device 108 obtained using the above equation is about 3.4 cm, a value less than the cutoff value. In this embodiment, the relatively small size of the plasma confinement device 108 facilitates generation of collimated plasma thereby obtaining smaller size beams.

In certain embodiments, microwaves of higher frequencies such as with frequencies in the millimeter wave regime may be used to create the plasma 104 within the plasma generation chamber 102. The usage of higher frequency microwaves to generate the plasma 104 within the plasma generation chamber 102 may allow using a relatively small plasma confinement device 108 thereby providing a compact FIB system. Moreover, use of high frequency microwaves results in substantially small sized beams. In one example, for microwaves having a frequency of about 18 GHz, the free space wavelength is about 2 cm and the cutoff wavelength is about 0.59 cm. The free space wavelength $\lambda_o$ is estimated using the following equation:

$$\lambda_o = c/f \quad (2)$$

where: c is velocity of light in vacuum ($=3\times10^8$ m/s); and f is the frequency of the waves.

Accordingly, for the microwaves with the frequency of about 18 GHz, the free space wavelength is estimated to be about 2 cm.

In the illustrated embodiment, the plasma confinement device 108 is a multicusp device that includes magnetic multipole ion reflecting walls 120 having a first set of magnets generally represented by reference numeral 122. The first set of magnets 122 is arranged with alternating polarity such that the B field at a center of the plasma confinement device 108 is zero. In the illustrated embodiment, each magnetic multipole ion reflecting wall 120 includes at least six magnets. However, a greater or lesser number of magnets may be used. In certain embodiments, the number of magnets is selected based on the length of the plasma generation chamber 102. For example, the magnetic multipole ion reflecting wall 120 can include 3, 4, 5, 6, 7, 8, 9, 10, 11, 12, or more magnets. In certain embodiments, the magnets are of substantially same size and of substantially equal magnetic field. In one example, the six permanent magnets include neodymium (NdFeB) magnets, each magnet of about 0.5 Tesla surface magnetic fields. In another example, the six permanent magnets include samarium cobalt (SmCo) magnets, each magnet of about 0.2 Tesla magnetic fields.

In the illustrated embodiment, the plasma confinement device 108 includes a second set of magnets 124 placed at the extraction end 112 of the plasma generation chamber 102. The second set of magnets 124 is configured to facilitate formation of the plasma meniscus 110 at the extraction end 112 of the plasma generation chamber 102. For example, the second set of magnets 124 can include 2, 3, 4, 5, 6, 7, 8, 9, 10, 11, 12, or more magnets. Each magnet can be the same or different from the other magnets. In one example, the second set of magnets 124 includes four magnets. However, a greater or a lesser number of magnets may be used. In one example, the six permanent magnets include neodymium (NdFeB) magnets, each magnet of about 0.5 Tesla surface magnetic fields. In another example, the six permanent magnets include samarium cobalt (SmCo) magnets, each magnet of about 0.2 Tesla magnetic fields.

In this embodiment, by using additional magnetic fields near the plasma meniscus 110 at the extraction end 112, a funnel effect in the flow of ion beams is achieved and as a result a plasma Taylor cone is realized adjacent to the beam extraction region. This reduces the beam demagnification factor and creates focused ion beams of substantially small size. In one example, the size of the focused ion beams is about 10 microns.

In certain embodiments, a spatial distribution of magnetic field applied with the first set of magnets 122 and the second set of magnets 124 is adjusted to form the plasma meniscus 110 at the extraction end 112 of the plasma generation chamber 102. In some examples, a plasma density of the generated plasma 104 is about $10^{10}$ centimeter$^{-3}$ (cm$^{-3}$) to about $10^{11}$ cm$^{-3}$ for waves having a frequency of about 2.45 GHz. The desired plasma density could be achieved by varying a microwave power of the microwaves 114, a gas pressure within the plasma generation chamber 102, frequency of the microwaves 114, or combinations thereof.

The FIB system 100 can further include, a beam extraction chamber 126 configured to extract a focused ion beam from the confined plasma 104 and to focus the extracted focused ion beam on a work piece 128 placed in a work piece holder 130 in a workpiece processing chamber 132. In some embodiments, the beam extraction chamber 126 is maintained at a pressure of about $10^{-5}$ Torr to about $10^{-6}$ Torr using a second turbo molecular pump 134.

The beam extraction chamber 126 can include a plasma electrode 136 configured to receive ions from the plasma generation chamber 102. In this embodiment, the plasma electrode 136 includes an aperture 138. In the illustrated embodiment, the plasma electrode 136 is held at ground potential. In some examples, an aperture size of the aperture 138 of the plasma electrode 136 is about 10 microns to about 1 mm. In some examples, the aperture size of the aperture 138 is about 10 microns to about 100 microns. Specific examples of aperture sizes include about 10 microns, about 20 microns, about 30 microns, about 40 microns, about 50 microns, about 60 microns, about 70 microns, about 80 microns, about 90 microns, about 100 microns, and ranges between any two of these values (including endpoints). The size of the aperture 138 can be selected to enhance the precision on beam and reduce the spot size of the generated beam.

The beam extraction chamber 126 can further include a first Einzel lens 140 configured to extract the focused ion beam from the plasma 104 and a second Einzel lens 142 configured to focus the extracted beam on the workpiece 128. The first Einzel lens 140 facilitates alignment of the extracted beam and the second Einzel lens 142 focuses the extracted beam on the workpiece 128. The first Einzel lens 140 includes a first electrode 144, a second electrode 146, and a third electrode 148. Similarly, the second Einzel lens 142 includes a first electrode 150, a second electrode 152 and a third electrode 154.

In the illustrated embodiment, the first electrode 144 and the third electrode 148 of the first Einzel lens 140 can be maintained at substantially same potential. Similarly, the first electrode 150 and the third electrode 154 of the second Einzel lens 142 can be maintained at substantially potential. In one example, the first electrode 144 and the third electrode 148 of the first Einzel lens 140 and the first electrode 150 and the third electrode 154 of the second Einzel lens 142 can be maintained at a potential of about 1.5 kilovolt (kV) to about 18 kV. Specific examples of potential include about 1.5 kV, about 5.0 kV, about 8.5 kV, about 12.0 kV, about 15.5 kV, about 18 kV, and ranges between any two of these values (including endpoints).

Moreover, the second electrode 146 of the first Einzel lens 140 and the second electrode 152 of the second Einzel lens 142 can be held at ground potential. In one example embodiment, the first electrode 144 and the third electrode 148 of the first Einzel lens 140 and the first electrode 150 and the third electrode 154 of the second Einzel lens 142 are maintained at a potential of about 1.5 kV and 18 kV respectively with a plasma electrode aperture 138 having size of about 0.5 millimeter (mm) thereby facilitating substantially high beam currents.

The beam extraction chamber 126 can further include a beam limiting slit 156 disposed between the first Einzel lens 140 and the second Einzel lens 142. The beam limiting slit 156 is configured to reduce a size of the extracted focused ion beam. In some embodiments, a size of an aperture of the beam limiting slit 156 is relatively smaller than the size of the aperture 138 of the plasma electrode 136, which facilitates reduction of the size of the extracted beam. In certain example embodiments, the beam limiting slit 156 has a diameter of about 0.2 mm to about 0.5 mm. Specific examples of slit diameter include about 0.2 mm, about 0.3 mm, about 0.4 mm, about 0.5 mm, and ranges between any two of these values (including endpoints).

In operation, the plasma meniscus 110 can be formed at the extraction end 112 of the plasma generation chamber 102 adjacent to the plasma electrode 136. As described before, the plasma electrode 136 is maintained at ground potential and the first electrode 144 of the first Einzel lens 140 is maintained at a negative potential. Here, ions from the plasma 104 arrive at the plasma electrode aperture 138 due to drop in potential in the plasma meniscus 110 formed adjacent to the grounded plasma electrode 136. These ions experience an electric field due to the negative potential of the first electrode 144 of the first Einzel lens 140 and are accelerated.

At the same time, the electric field can repel the electrons in the plasma 104. The shape of the plasma meniscus 110 or the emission surface adjusts itself so that there is equilibrium between the plasma ion fluxes arriving at the plasma meniscus 110. The shape of the plasma meniscus 110 is determined as a self-consistent condition involving the rate of influx of ions from the plasma 104 to the plasma meniscus 110 and the rate of extraction of the ions by the extractor. In some examples, the initial trajectories of the ions and the energy distribution are dependent on the geometry of the plasma meniscus 110.

In some examples, the generated focused ion beams from the FIB system 100 can have a diameter of about 10 microns to about 20 microns. Specific examples of slit diameter include about 10 microns, about 12 microns, about 14 microns, about 16 microns, about 18 microns, about 20 microns, and ranges between any two of these values (including endpoints). Further, with a smaller plasma electrode aperture size and higher focusing voltages, the beam size may be further reduced for obtaining focused ions beams with size in sub micron and nanometer ranges.

In certain examples, an energy spread of the focused ion beams is equal to or less than to about 8 electronvolts (eV) and a power density of about 5 watts per square centimeter ($W/cm^2$) to about 10 $W/cm^2$. In one example embodiment, the energy spread of the focused ion beams is about 5 eV to about 8 eV. Specific examples of the energy spread for the focused ion beams include about 5 eV, about 6 eV, about 7 eV, about 8 eV, and ranges between any two of these values (including endpoints). Moreover, specific examples of the power density include about 5 $W/cm^2$, about 6 $W/cm^2$, about 7 $W/cm^2$, about 8 $W/cm^2$, about 9 $W/cm^2$, about 10 $W/cm^2$, and ranges between any two of these values (including endpoints). In certain examples, a milling depth of a substrate, is controlled, by selecting a mass of ions that provide a relatively higher sputtering yield. In some examples, a milling depth for a silicon substrate using a 10 micron focused ion beam is about 100 microns.

In certain embodiments, the focused ion beams have a beam current of relatively equal to or greater than about 10 microamperes. It should be noted that the current of the ion beam may be varied by changing a type of the gas, working gas pressure, microwave power, size of the aperture of the plasma electrode, slit and efficiency of the focusing electrodes. In one example embodiment, the beam currents for hydrogen, argon and krypton gases used in the FIB system 100 are about 10 microamperes (μA), 2.2 μA and 1.5 μA respectively at a power of about 350 Watts and at a pressure of 0.25 mTorr for argon and krypton and 0.8 mTorr for hydrogen.

In the illustrated embodiment, the generated focused ion beam from the beam extraction chamber 126 can be focused on the workpiece 128 placed within the workpiece processing chamber 132. In some embodiments, the workpiece processing chamber 132 may include a faraday cup (not shown) to measure the beam current for estimating the beam spot size. In some embodiments, the workpiece processing chamber 132 is maintained at a pressure of $10^{-5}$ Torr to about $10^{-6}$ Torr using a third turbo molecular pump 158.

In some examples, the ion beams focused on the workpiece 128 form beam spots having a diameter about 10 microns to about 25 microns without a magnetic octupole at a focusing voltage of about 24 kV and the plasma electrode aperture having a size of about 0.5 mm. The workpiece 128 may include, but are not limited to, aluminum substrate, copper substrate, steel substrate or combinations thereof. Additionally, depending upon the application, non-metallic substrates such as silicon, silicon wafer or quartz may also be used.

EXAMPLES

The present invention will be described below in further detail with examples and comparative examples thereof, but it is noted that the present invention is by no means intended to be limited to these examples.

Example 1

Configuration of an Example FIB System

A FIB system with a structure as described above with reference to FIG. 1 was used to generate focused ion beams. Here, continuous mode microwaves having a frequency of 2.45 GHz and 1.2 kW peak power were introduced into the multicusp plasma generation chamber. The plasma confinement device included cylindrical octupole multicusp formed of rectangular pipes. Each of the rectangular pipes included six permanent NdFeB magnets having 0.5 Tesla surface magnetic fields. The magnets were arranged with alternate polarity to achieve B field at the center of the plasma confinement device to be zero. The multicusp plasma confinement device with an inner radius of about 4 cm was end plugged by reversing the polarity of the end magnets for axial plasma confinement.

The beam extraction chamber with the plasma electrode, two sets of Einzel lenses and a beam limiting slit (such as described above with reference to FIG. 1) was attached to an edge of the multicusp plasma confinement device. The plasma was generated within the plasma generation chamber at a pressure of about 0.1 mTorr to about 0.5 mTorr with about 100 W to about 300 W microwave power. Here, argon, krypton and hydrogen gases were used for plasma generation. The pressure inside the beam chamber was maintained at approximately $5 \times 10^{-6}$ Torr. A faraday cup was used to measure the beam current and the beam spot size of the generated focused beams.

Here, the measured beam current on the work piece was about 1 microamperes to about 10 microamperes that was substantially higher than the beam currents from conventional FIB systems. The system described above was used to generate focused ion beams of elements such as argon (Ar), neon (Ne), helium (He), krypton (Kr) and other molecular gases for use in a variety of applications to overcome limitations of conventional FIB systems. The system can facilitate generation of high beam currents for micron sized beam spots and relatively low beam currents for nanometer sized beam spots for use in several processing and fabrication applications.

Example 2

Ion Energy Distribution in the Plasma Meniscus

Figure 2:
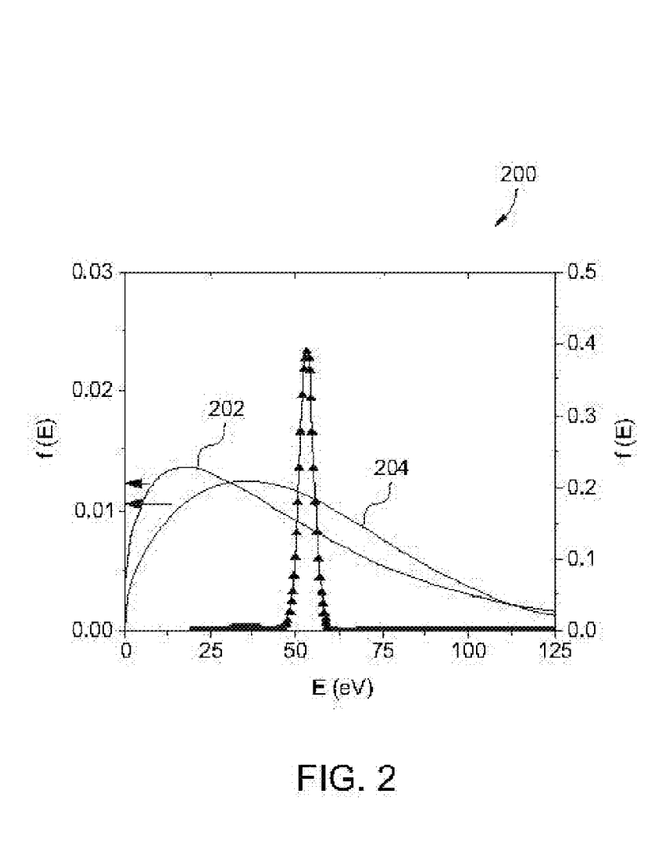
FIG. 2 is a graphical representation of an example ion energy distribution at a plasma meniscus generated within a FIB system.

FIG. 2 is a graphical representation 200 of ion energy distribution and comparison of the distribution with standard distributions Maxwellian 202 and Druyvesteyn 204 at the plasma meniscus within the FIB system of Example 1. The ion energy distribution adjacent to the plasma meniscus was obtained using an ion energy analyzer probe. Here collector current was measured as a function of variable retarding potential applied on an ion discriminator grid of the ion energy analyzer probe. Further, the ion energy distribution was estimated using numerical differentiation of obtained I-V characteristics.

As can be seen, measured axial ion energy distribution adjacent to the plasma meniscus indicated that the beams were substantially monoenergetic with an energy spread of about 5 eV that was comparable to energy spread of beams obtained from conventional FIB systems. The experimental ion energy distributions were compared with standard model energy distribution functions of substantially same mean energy. As can be seen, profiles 202 and 204 of the ion energy distribution 200 indicated the Maxwellian and Druyvesteyn distributions of the same mean energy.

Example 3

Simulation Results of Focused Ion Beam

Figure 3:
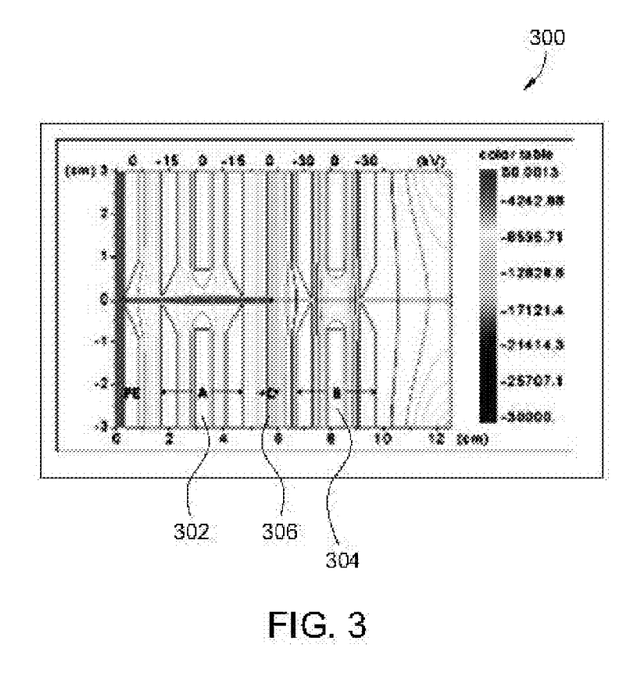
FIG. 3 is a graphical representation of an ion beam trajectory of a focused ion beam generated using a FIB system.

FIG. 3 is a graphical representation of an ion beam trajectory 300 of a focused ion beam generated using the FIB system of Example 1. Here, AXCEL-INP simulation code commercially available from AET, Inc., Japan was used to simulate the trajectory of the ion beam from a plasma source with electrostatic Einzel lenses placed in the beam path. The plasma source was kept at ground potential and the plasma electrode had an aperture size of 1 mm. A first Einzel lens (A) and a second Einzel lens (B) generally represented by reference numerals 302 and 304 were employed in the ion beam line for focusing purposes.

Here, each of the first and second Einzel lenses 302 and 304 included three electrodes having apertures with aperture size of 2, 14, and 2 mm, respectively, and a thickness of 6 mm. The electrode angle was maintained at 33.5°. The first Einzel lens 302 made the beam parallel and the second Einzel lens focused the beam towards a spot. The first and third electrodes of the first Einzel lens 302 (A) were maintained at a potential of −15 kV while the second electrode was maintained at ground potential.

A beam limiting slit (C) represented by reference numeral 306 having an aperture with diameter of 500 micrometer was used in the path of the beam, after the first lens. The second Einzel lens B had electrodes maintained at potential of about used −30 kV potential to focus the beam. The various electrode design parameters such as thickness, aperture size, angle, potentials, inter-electrode separation, etc., were optimized to obtain a focused beam. The parallel beam from the first Einzel lens 302 was reduced in size by the beam limiting slit 306 and the outcoming beam was focused using the second Einzel lens 304 to obtain spot size of less than 10 micrometers.

Example 4

Measurement of Beam Spot Size Using High Resolution Microscope

Figure 4:
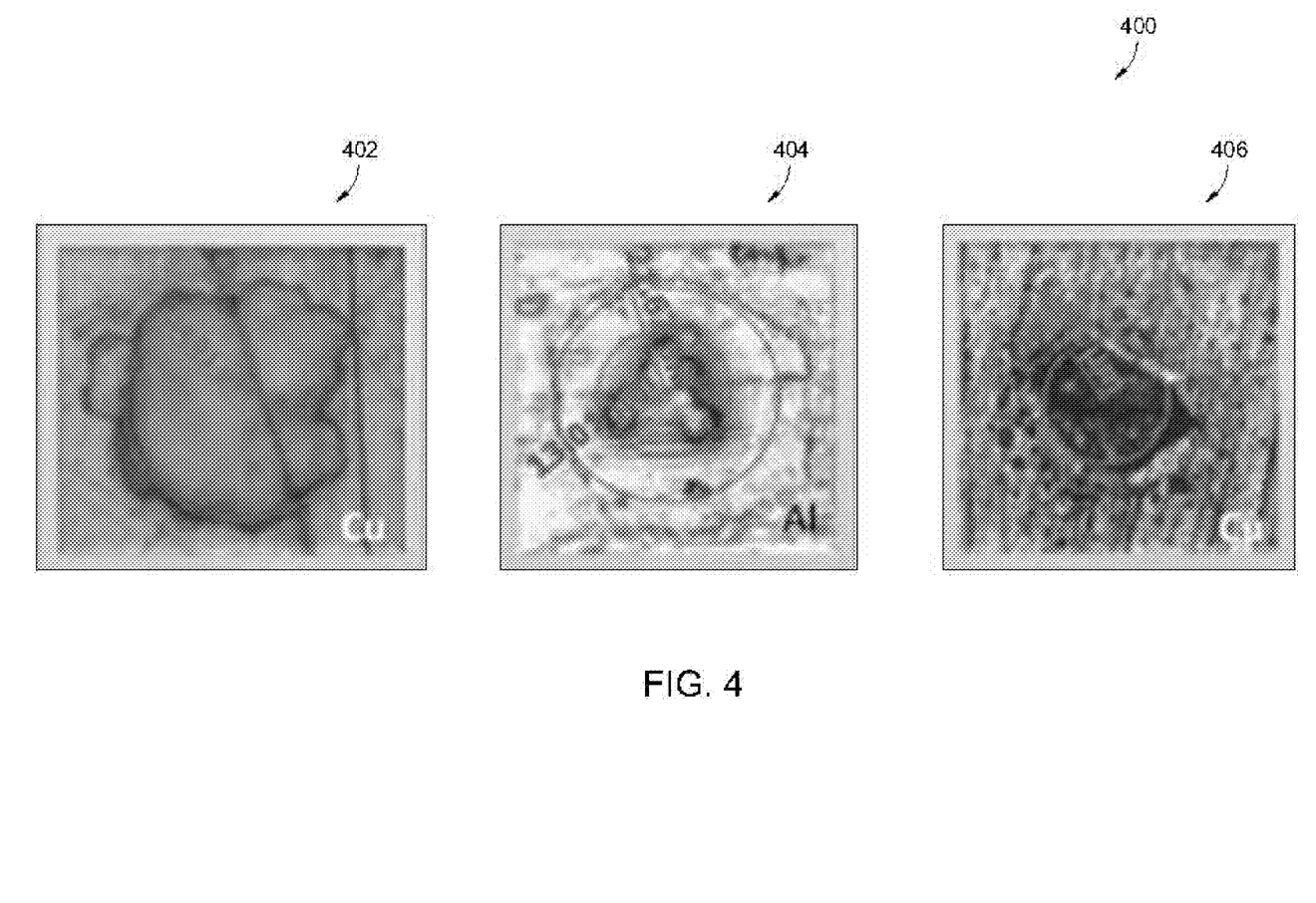
FIG. 4 shows example images of craters formed on, different metallic substrates using a focused ion beam generated by a FIB system.

FIG. 4 illustrates example images 400 of craters formed on different metallic substrates using a focused ion beam generated by the FIB system of Example 1. The craters were formed using beams at pressure of 0.35 mTorr and microwave power of 250 W by exposure on the substrates for different time durations. The beam spot size was measured using a high resolution optical microscope, Carl Zeiss, Axio Imager A1.m, commercially available from Carl Zeiss Microscopy LLC, U.S.A and to capture the craters formed on the metallic substrates by beam exposure. Each of the substrates was positioned at about 1.5 cm from the last electrode of the focusing column.

Example images 402 and 404 show craters formed on copper and aluminum substrates exposed to an argon beam for about 30 seconds and 60 seconds respectively. Each of the substrates was positioned at about 1.5 cm from the last electrode of the electrostatic lenses of the beam extraction chamber. As can be seen from image 404, a core region of size about 25 microns was seen in the aluminum substrate due to longer irradiation time and aluminum being a soft metal. The spot size was measured to be about 40 microns, which was in agreement with the simulation.

Example image 406 shows crater formed on a copper substrate exposed to the beam for about 1.5 minutes and the spot formed by the beam was observed to be substantially deeper in this case. Although the beam was spread on a larger region, the core region was observed to be of about 25 micron in size. The beam current on the copper substrate was measured to be relatively greater than 100 nanoamperes.

As described above, the present technique for generating focused ion beams facilitates generation of high frequency wave plasmas with substantially high plasma densities, low ion energy spread and relatively high plasma stability as compared to other sources that are based on direct current, filament based or radio frequency sources. The FIB system described above enables a plasma confinement using minimum B multicusp plasma confinement devices that provides uniform, un-magnetized axial plasma in the central region of the FIB system from where the beams are extracted. Also, the use of such FIB system facilitates efficient sputtering and patterning of surface materials by different elements thereby reducing the cost of manufacturing.

The FIB system described above also facilitates control of the extracted ion beam currents independent of the extraction voltage by controlling the discharge power and pressure. The FIBs generated using the system described above may be used in a variety of applications such as micron to nanoscale milling, implantation, controlled formation of nanopores in biological membranes and microfluidic applications.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present.

For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.).

It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc.

As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A focused ion beam (FIB) system comprising:
    a plasma generation chamber configured to contain a source gas that is radiated with microwaves to produce plasma, wherein the plasma generation chamber comprises:
        a multicusp plasma confinement device having a first set of magnets to confine the plasma in radial and axial directions within the plasma generation chamber and a second set of magnets to facilitate formation of a plasma meniscus at an extraction end of the plasma generation chamber; and
    a beam extraction chamber comprises:
        a plasma electrode configured to receive ions from the plasma generation chamber;
        a first Einzel lens configured to extract a focused ion beam from the confined plasma;
        a beam limiting slit disposed adjacent to the first Einzel lens to reduce a size of the extracted focused ion beam; and
        a second Einzel lens disposed adjacent to the beam limiting slit, configured to focus the extracted focused ion beam on a workpiece, wherein a beam spot formed on the workpiece by the focused ion beam has a diameter of about 10 microns to about 20 microns.

2. The system of claim 1, wherein the plasma confinement device further comprises magnetic multipole ion reflecting walls having the first set of magnets with alternating polarity.

3. The system of claim 1, wherein the plasma electrode is held at ground potential.

4. The system of claim 1, wherein the plasma electrode comprises an aperture having a size of about 10 microns to about 1 mm.

5. The system of claim 1, wherein the beam limiting slit has a diameter of about 0.2 mm to about 0.5 mm.

6. The system of claim 1, wherein the beam extraction chamber is maintained at a pressure of about $10^{-5}$ Torr to about $10^{-6}$ Torr.

7. The system of claim 1, wherein the microwaves have a frequency of about 4 GHz about 18 GHz.

8. The system of claim 1, wherein the generated plasma has a plasma density of about $10^{10}$ cm$^{-3}$ to about $10^{11}$ cm$^{-3}$.

9. The system of claim 1, wherein each of the first Einzel lens and the second Einzel lens comprises a first electrode, a second electrode, and a third electrode, wherein the second electrode of each of the first Einzel lens and the second Einzel lens is held at ground potential.

10. The system of claim 9, wherein the first electrode and the third electrode of each of the first Einzel lens and the second Einzel lens are maintained at a potential of about 1.5 kV to about 18 kV.

11. A method for generating focused ion beams, the method comprising:
    radiating a source gas with microwaves have a frequency in a range of 4 GHz to about 18 GHz to generate plasma within a plasma generation chamber; confining the plasma in radial and axial directions within the generation chamber and forming a plasma meniscus near an extraction end of the plasma generation chamber;
    extracting focused ion beams from the confined plasma in a beam extraction chamber using a first Einzel lens;
    limiting a size of the extracted focused ion beams using a beam limiting slit placed adjacent to the first Einzel lens; and focusing the focused ion beams on a workpiece using a second Einzel lens disposed adjacent to the beam limiting slit.

12. The method of claim 11, wherein confining the plasma in the radial and axial direction comprises applying multicusp magnetic fields within the plasma generation chamber.

13. The method of claim 12, further comprising tailoring a spatial distribution of the applied magnetic fields to form the plasma meniscus adjacent to the extraction end of the plasma generation chamber.

14. A focused ion beam (FIB) system, the system comprising:
   a plasma generation chamber configured to contain a source gas that is radiated with microwaves have a frequency in a range of 4 GHz to 18 GHz to produce plasma, wherein the plasma generation chamber comprises:
      a multicusp plasma confinement device having a first set of magnets to confine the plasma in radial and axial directions within the plasma generation chamber and a second set of magnets to facilitate formation of a plasma meniscus at the extraction end of the plasma generation chamber; and
   a beam extraction chamber comprises:
      a plasma electrode configured to receive ions from the plasma generation chamber;
      a first Einzel lens configured to extract a focused ion beam from the confined plasma;
      a beam limiting slit disposed adjacent to the first Einzel lens to reduce a size of the extracted focused ion beam; and
      a second Einzel lens disposed adjacent to the beam limiting slit, configured to focus the extracted beams onto a workpiece placed in a workpiece processing chamber.

15. The system of claim 14, wherein the multicusp plasma confinement device is formed of magnetic multipole ion reflecting walls, each wall having at least six magnets with alternating polarity.

16. The system of claim 14, wherein the plasma electrode comprises an aperture having a size of about 10 microns to about 100 microns.

17. The system of claim 11, wherein the plasma generation chamber is maintained at a pressure of about $10^{-3}$ Torr to about $10^{-4}$ Torr.

18. The system of claim 14, wherein the focused ion beams have an energy spread of equal to or less than about 8 eV.

19. The system of claim 14, wherein the focused ion beams have a power density of about 5 W/cm$^2$ to about 10 W/cm$^2$.

20. The system of claim 14, wherein the focused ion beams have a focused beam current of equal to or greater than about 10 microamperes.

* * * * *